(12) United States Patent
Casey et al.

(10) Patent No.: US 7,022,251 B2
(45) Date of Patent: *Apr. 4, 2006

(54) METHODS FOR FORMING A CONDUCTOR ON A DIELECTRIC

(75) Inventors: John F. Casey, Colorado Springs, CO (US); Lewis R. Dove, Monument, CO (US); Ling Liu, Colorado Springs, CO (US); James R. Drehle, Colorado Springs, CO (US); R. Frederick Rau, Jr., Colorado Springs, CO (US); Rosemary O. Johnson, Colorado Springs, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 167 days.

This patent is subject to a terminal disclaimer.

(21) Appl. No.: 10/601,042

(22) Filed: Jun. 19, 2003

(65) Prior Publication Data

US 2004/0256350 A1    Dec. 23, 2004

(51) Int. Cl.
*C23F 1/00* (2006.01)

(52) U.S. Cl. .................... 216/100; 216/95; 216/96; 216/97; 216/98; 29/846; 29/847; 29/851

(58) Field of Classification Search ............ 216/95–97, 216/99–102, 104, 105, 107, 109; 29/846, 29/847, 851
See application file for complete search history.

(56) References Cited

U.S. PATENT DOCUMENTS

| | | | |
|---|---|---|---|
| 3,808,042 A | 4/1974 | Dietz | |
| 4,303,480 A * | 12/1981 | Wood et al. | 361/748 |
| 4,806,941 A * | 2/1989 | Knochel et al. | 343/700 MS |
| 4,808,274 A * | 2/1989 | Nguyen | 361/748 |
| 5,317,292 A | 5/1994 | Leeb | |
| 5,357,138 A | 10/1994 | Kobayashi | |
| 5,426,399 A | 6/1995 | Matsubayashi et al. | |
| 5,910,334 A | 6/1999 | Lautzenhiser et al. | |
| 6,000,120 A | 12/1999 | Arledge et al. | |
| 6,255,730 B1 | 7/2001 | Dove et al. | |
| 6,353,189 B1 | 3/2002 | Shimada et al. | |
| 6,420,778 B1 | 7/2002 | Sinyansky | |
| 6,457,979 B1 | 10/2002 | Dove et al. | |
| 2001/0012692 A1* | 8/2001 | Miller et al. | 438/669 |
| 2004/0023482 A1 | 2/2004 | Dell'Ova et al. | |
| 2004/0257194 A1* | 12/2004 | Casey et al. | 338/314 |
| 2004/0258841 A1* | 12/2004 | Casey et al. | 427/372.2 |

FOREIGN PATENT DOCUMENTS

JP    03006818 A    1/1991

OTHER PUBLICATIONS

Wolf et al., Silicon Processing for the VLSI Era, 1986, Lattice Press, vol. 1, pp. 531-535.*

(Continued)

*Primary Examiner*—Nadine G. Norton
*Assistant Examiner*—Eric B. Chen

(57) ABSTRACT

Disclosed is a method for forming a conductor on a dielectric. The method commences with the deposition of a conductive thickfilm on the dielectric, followed by a "subsintering" of the conductive thickfilm. Either before or after the subsintering, the conductive thickfilm is patterned to define at least one conductor. After subsintering, the conductive thickfilm is etched to expose the conductor(s), and the conductor(s) are then fired. A brief chemical etch may be used after the final firing step if improved wire-bondability is required.

15 Claims, 2 Drawing Sheets

OTHER PUBLICATIONS

John F. Casey, et al., "Methods for Depositing a Thickfilm Dielectric on a Substrate", New Patent Application (9 pages of specification, 4 pages of claims and 1 page abstract), 2 sheets of formal drawings, Filed Jun. 19, 2003.

John F. Casey, et al., "Methods for Making Microwave Circuits", New Patent Application (30 pages of specification (21 pages of specification, 8 pages of claims and 1 page abstract), 9 sheets of formal drawings, Filed Jun. 19, 2003.

* cited by examiner

METHODS FOR FORMING A CONDUCTOR ON A DIELECTRIC

CROSS-REFERENCE TO RELATED APPLICATIONS

This application is related to the application of John F. Casey, et al. entitled "Methods for Making Microwave Circuits", filed on the same date as this application Ser. No. 10/600,143 and to the application of John F. Casey, et al. entitled "Methods for Depositing a Thickfilm Dielectric on a Substrate", also filed on the same date as this application Ser. No. 10/600,600. These applications are hereby incorporated by reference for all that they disclose.

BACKGROUND

Microwave circuits have traditionally been built using individual thinfilm components (e.g., microstrips or bent microstrips) that are then assembled with one or more active circuit die into a machined metal package that is commonly referred to as "a gold brick". These machined packages often make up a substantial fraction of the cost of the final completed circuit. For simpler brick machining and improved impedance matching, the thinfilm components are ideally the same thickness as the die itself. However, high frequency microwave circuits translate to high power . . . high power translates to high heat dissipation . . . high heat dissipation translates to very thin die . . . thin die translate to thin, thinfilm components . . . thin, thinfilm components translate to fragile substrates . . . and fragile substrates translate to low-yield, high-cost processing.

SUMMARY OF THE INVENTION

One aspect of the invention is embodied in a method for forming a conductor on a dielectric. The method comprises depositing a conductive thickfilm on the dielectric and then "subsintering" the conductive thickfilm. Either before or after the subsintering, the conductive thickfilm is patterned to define at least one conductor. After subsintering, the conductive thickfilm is etched to expose the conductor(s), and the conductor(s) are then fired at a full sintering temperature.

Other embodiments of the invention are also disclosed.

BRIEF DESCRIPTION OF THE DRAWINGS

Illustrative embodiments of the invention are illustrated in the drawings, in which.

DETAILED DESCRIPTION OF THE INVENTION

Figure 1:
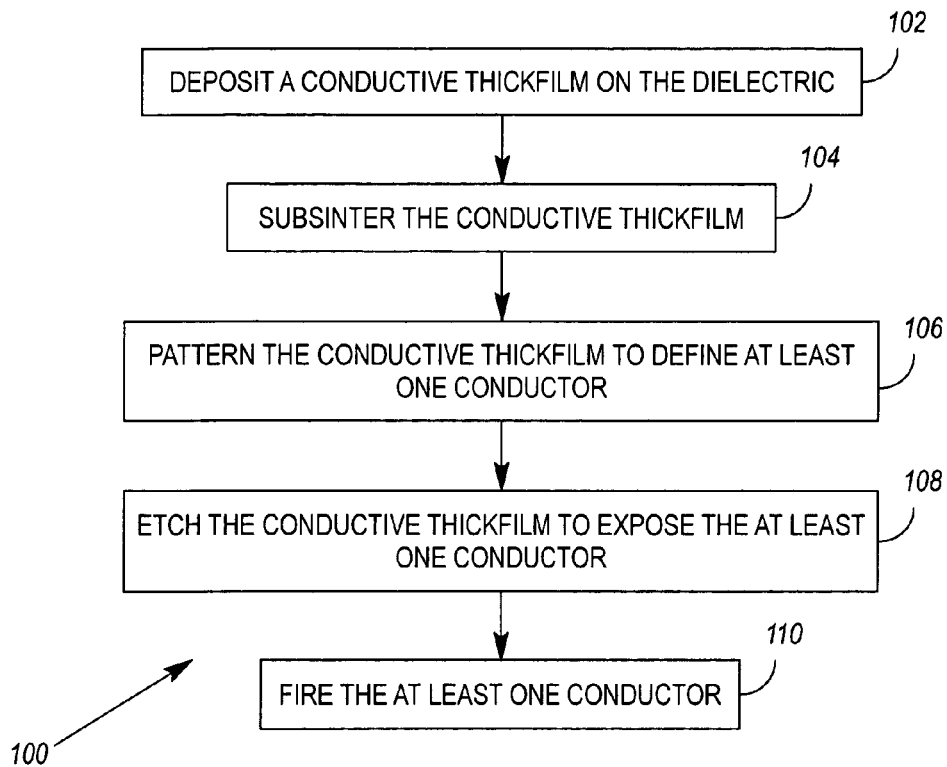
FIG. 1 illustrates a method for forming a conductor on a dielectric.

When depositing certain conductive thickfilms on certain dielectrics, the conductive thickfilms react with the dielectrics to produce an interface layer that is more difficult to etch than if the same conductive thickfilms are deposited on substrates such as lapped alumina ceramics. FIG. 1 therefore illustrates a novel method for forming a conductor on a dielectric. The method 100 commences with the deposition 102 of a conductive thickfilm on the dielectric, followed by a "subsintering" 104 of the conductive thickfilm. Subsintering is defined herein as a heating process that is performed at a temperature greater than a mere "drying" temperature of the conductive thickfilm, but at a temperature less than a manufacturer's recommended "firing" temperature for the conductive thickfilm.

The subsintering atmosphere, temperature and time should be sufficient to drive off and burn off unwanted organic materials to form a coherent, but not fully densified, conductive film that can be patterned successfully by chemical etching. The deleterious effects of the aforementioned interface layer are greatly reduced by subsintering. Subsintering produces a conductive thickfilm layer that is sufficiently resistant to chemical etching to allow good pattern definition while minimizing the extent of the interface layer. The actual formation of the interface layer is determined by complex solid-state diffusion mechanisms which are highly time and temperature dependent. Minimizing the extent of the interface layer allows it to be removed in the same etch process prior to unwanted over-etching of a conductor (or conductors) patterned in the conductive thickfilm. Either before or after the subsintering, the conductive thickfilm is patterned 106 to define at least one conductor. After the subsintering, the conductive thickfilm is etched 108 to expose the conductor(s). The conductor(s) are then fired 110 at a full sintering temperature.

Figure 2:
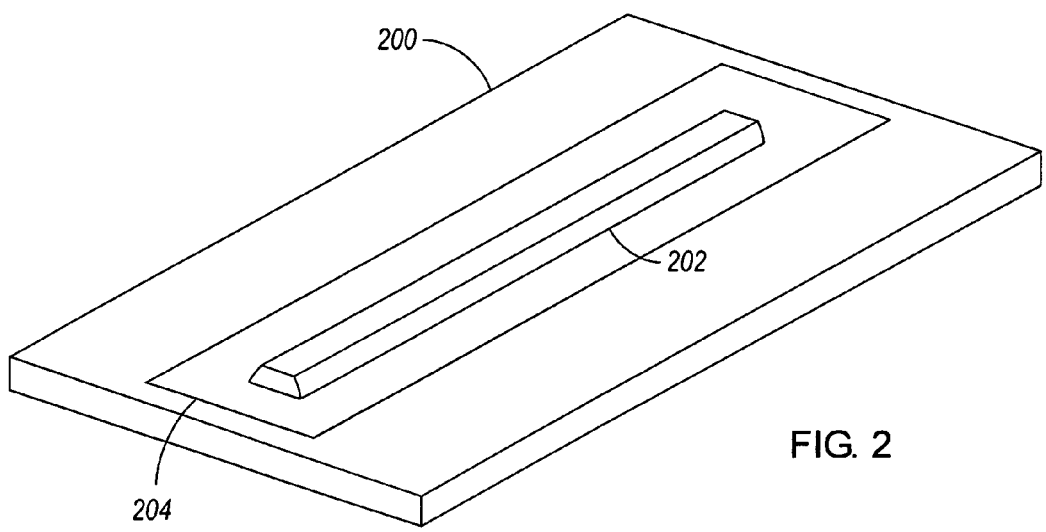
FIG. 2 illustrates a dielectric deposited on a substrate.

FIGS. 2–5 illustrate an exemplary application of the above method. FIG. 2 illustrates a substrate 200 that, by way of example, may be a 40 mil lapped alumina ceramic substrate. The substrate 200 comprises a around plane 204 on a top surface thereof. However, the around plane might also be on the bottom surface of the substrate, or even interior to the substrate. For purposes of this description, the phrase "around plane" is intended to cover around planes that substantially or completely cover a surface, as well as around traces that function as around planes with respect to one or more particular conductors.

A dielectric 202 is deposited on the substrate 200 in any of a variety of configurations and, by way of example, may form a long and narrow plateau having a more or less trapezoidal cross-section. See FIG. 3. In one embodiment, the dielectric is the KQ CL-90-7858 dielectric (a glass dielectric) available from Heraeus Cermalloy (24 Union Hill Road, West Conshohocken, Pa. USA). However, the dielectric may be another dielectric and, particularly, may be another KQ dielectric, glass dielectric, or any other dielectric with suitable electrical properties. The low loss (about $1 \times 10^4$) and low dielectric constant (about 3.9) of KQ CL-90-7858 (a borosilicate glass-based material) makes it particularly suited for building microwave circuits (e.g., microwave transmission lines).

Figure 3:
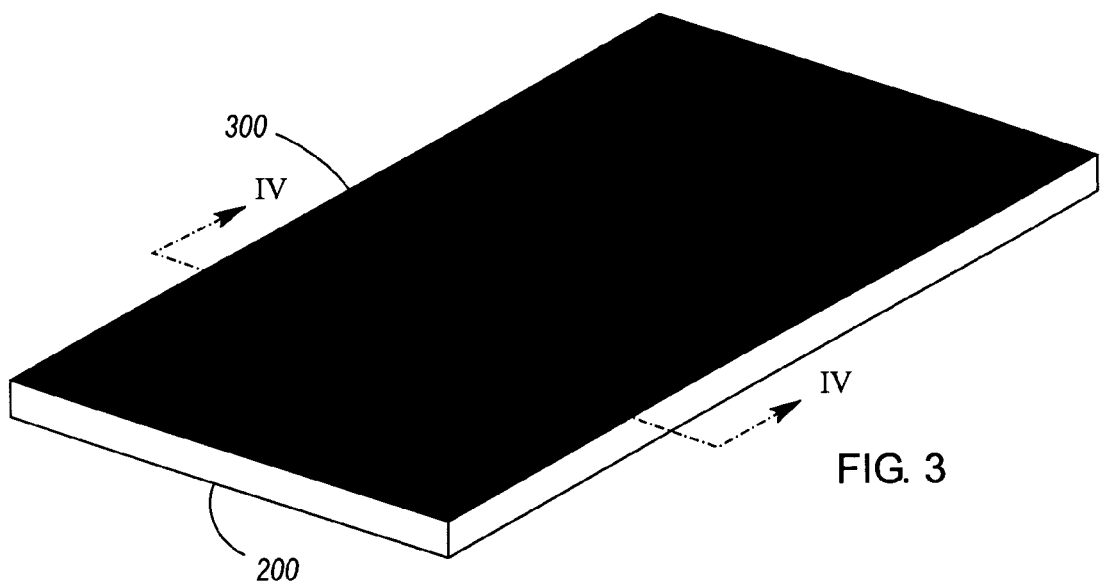
FIG. 3 illustrates the deposition of a conductive thickfilm on the FIG. 2 dielectric.
Figure 4:
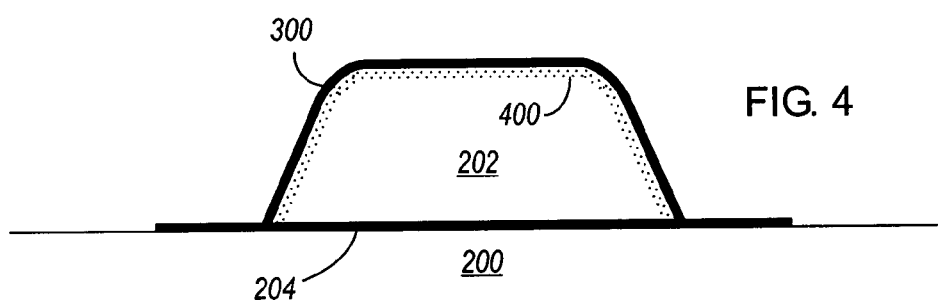
FIG. 4 illustrates a cross-section of FIG. 3.
Figure 5:
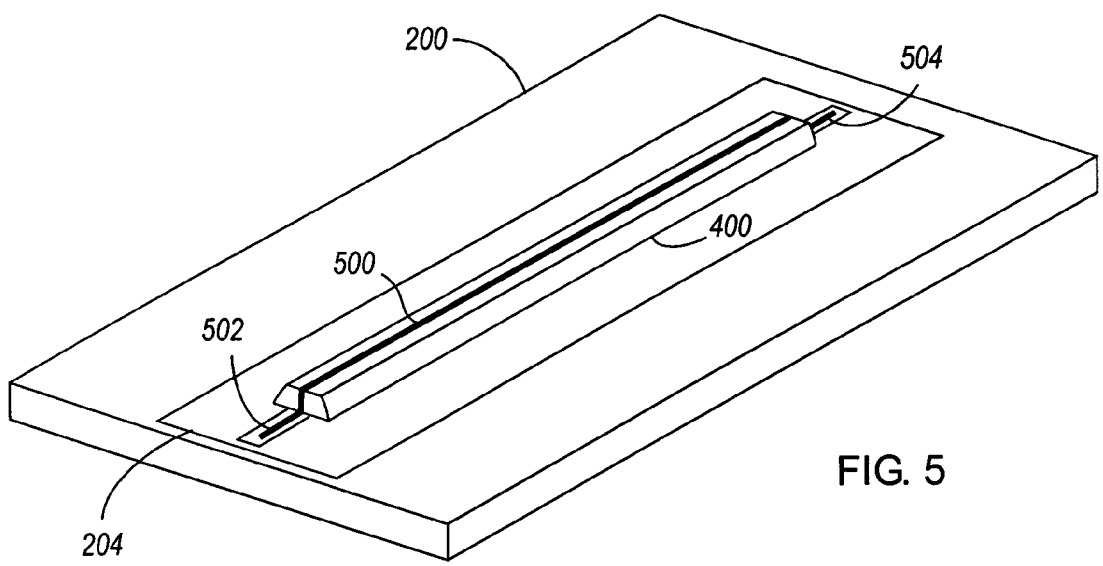
FIG. 5 illustrates the conductive thickfilm of FIGS. 3 & 4 after patterning and etching.

As shown in FIGS. 3 & 4, a conductive thickfilm 300 is deposited on the dielectric 202. The conductive thickfilm 300 may be deposited in a number of ways, including screen printing, stencil printing and doctor blading. In one embodiment, the conductive thickfilm comprises gold, such as DuPont QG150 (available from DuPont (1007 Market Street, Wilmington, Del., USA)).

The conductive thickfilm 300 may be deposited solely on the dielectric 202 or, as shown in FIG. 3, may be deposited over portions of both the dielectric 202 and the substrate 200.

As previously mentioned, some conductive thickfilms react with the dielectrics on which they are deposited, thereby producing an interface layer 400 between the conductive thickfilm 300 and dielectric 202 that is more difficult to etch than if the same conductive thickfilm were deposited on a substrate such as a lapped alumina ceramic substrate. Such an interface layer 400 is formed when DuPont QG150 is deposited on KQ CL-90-7858. This interface layer is best seen in FIG. 4, which shows a cross-section of the dielectric and conductive thickfilm shown in FIG. 3.

If conductors are patterned and etched in DuPont QG150 immediately after it is deposited on KQ CL-90-7858, the time required to etch the interface layer 400 may be long enough that unwanted etching of patterned conductors 500, 502, 504 occurs. That is, the etch time may be long enough that walls and edges of patterned conductors begin to erode, possibly changing the desired impedance of the conductors. The effects of unwanted conductor etch are compounded when A) a conductive thickfilm 300 is deposited over two or more different materials, and B) the conductive thickfilm 300 tends to etch more quickly over one of the materials. For example, DuPont QG150 deposited on an alumina ceramic substrate etches more quickly than DuPont QG150 deposited on KQ CL-90-7858.

The problems mentioned in the above paragraph may be mitigated by "subsintering" the conductive thickfilm 300 prior to etch. As previously mentioned, subsintering is a heating process that is performed at a temperature greater than a mere "drying" temperature of the conductive thickfilm, but at a temperature less than a manufacturer's recommended "firing" temperature for the conductive thickfilm. For DuPont QG150 deposited on KQ CL-90-7858, subsintering at a peak temperature between 725° C. and 850° C. has been found to be effective, and subsintering at a peak tempeprature of about 725° C. for about ten minutes has been found to be most effective.

After the conductive thickfilm 300 is subsintered, it is sufficiently resistant to chemical etching, thereby allowing the interface layer 400 to be etched prior to unwanted over-etching of conductors 500–504 that are patterned in the conductive thickfilm. Subsintering at an appropriate time and temperature also helps to equalize the etch rates of a conductive thickfilm deposited on two different materials (e.g., DuPont QG150 and KQ CL-90-7858).

Conductors 500–504 may be patterned in the conductive thickfilm 300 before or after subsintering and, after subsintering, the conductive thickfilm may be etched (e.g., chemically etched) to expose the conductor(s). See FIG. 11. After etch and any necessary cleaning (e.g., washing or rinsing), the exposed conductors 500–504 are fired. For DuPont QG150 conductors, firing may be undertaken at a peak temperature of about 850° C.

When multiple similar firing cycles follow the conductor etch process and, if interconnection wires are to be connected to the final circuit by thermocompression wirebonding, it may be advantageous to perform a mild chemical etch process after the final firing cycle. The subsintering process described herein may result in a somewhat more difficult surface to bond to. However, an approximately 20 second dip in an unheated solution of 10:1 hydrofluoric acid to de-ionized water, followed by de-ionized water rinse and dry, has been found to be effective to restore excellent bondability. Any sensitive elements, such as thickfilm resistors, may be protected during this brief chemical dip by any number of simple, easily removed masking materials, such as a photoresist or even simple tape.

While illustrative and presently preferred embodiments of the invention have been described in detail herein, it is to be understood that the inventive concepts may be otherwise variously embodied and employed, and that the appended claims are intended to be construed to include such variations, except as limited by the prior art.

What is claimed is:

1. A method for forming a conductor on a dielectric, comprising:
   a) depositing a conductive thickfilm on the dielectric;
   b) subsintering the conductive thickfilm;
   c) patterning the conductive thickfilm to define at least one conductor;
   d) etching the conductive thickfilm to expose the at least one conductor; and
   e) firing the at least one conductor at a full sintering temperature.

2. The method of claim 1, wherein the conductive thickfilm comprises gold.

3. The method of claim 1, wherein the dielectric is a glass dielectric.

4. The method of claim 1, wherein said subsintering comprises subsintering at a peak temperature of about 725° C. for about ten minutes.

5. The method of claim 4, wherein the conductive thickfilm comprises gold and the dielectric comprises a borosilicate glass-based material with a dielectric constant of about 3.9 and a loss tangent of about $1 \times 10^{-4}$.

6. The method of claim 1, wherein said subsintering comprises subsintering at a peak temperature between 725° C. and 850° C.

7. The method of claim 6, wherein the conductive thickfilm comprises gold and the dielectric comprises a borosilicate glass-based material with a dielectric constant of about 3.9 and a loss tangent of about $1 \times 10^{-4}$.

8. The method of claim 1, further comprising depositing the conductive thickfilm on a substrate at about the same time the conductive thickfilm is deposited on the glass dielectric.

9. The method of claim 8, wherein the substrate is an alumina ceramic substrate.

10. The method of claim 8, wherein the subsintering is undertaken at a peak temperature that equalizes the etch rates of the conductive thickfilm on the substrate and the glass dielectric.

11. The method of claim 10, wherein said subsintering comprises subsintering at a peak temperature of about 725° C. for about ten minutes.

12. The method of claim 11, wherein the conductive thickfilm comprises gold and the dielectric comprises a borosilicate glass-based material with a dielectric constant of about 3.9 and a loss tangent of about $1 \times 10^{-4}$.

13. The method of claim 12, wherein the substrate is an alumina ceramic substrate.

14. The method of claim 10, wherein said subsintering comprises subsintering at a peak temperature between 700° C. and 850° C.

15. The method of claim 1, further comprising, after firing, dipping the at least one conductor in an unheated solution of 10:1 hydrofluoric acid to de-ionized water for about ten seconds, and then rinsing the at least one conductor in de-ionized water.

* * * * *

UNITED STATES PATENT AND TRADEMARK OFFICE
CERTIFICATE OF CORRECTION

PATENT NO. : 7,022,251 B2  Page 1 of 1
APPLICATION NO. : 10/601042
DATED : April 4, 2006
INVENTOR(S) : Casey et al.

It is certified that error appears in the above-identified patent and that said Letters Patent is hereby corrected as shown below:

On the face page, in field (75), in "Inventors", in column 1, line 8, after "(US)" insert -- ; Julius Botka, Santa Rosa, CA (US) --.

Signed and Sealed this

Sixth Day of March, 2007

JON W. DUDAS
*Director of the United States Patent and Trademark Office*